(12) United States Patent
Yen et al.

(10) Patent No.: US 6,960,411 B2
(45) Date of Patent: Nov. 1, 2005

(54) MASK WITH EXTENDED MASK CLEAR-OUT WINDOW AND METHOD OF DUMMY EXPOSURE USING THE SAME

(75) Inventors: Yu-Lin Yen, Taipei (TW); Ching-Yu Chang, Ilai (TW); Shun-Li Lin, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 81 days.

(21) Appl. No.: 10/314,959

(22) Filed: Dec. 10, 2002

(65) Prior Publication Data

US 2004/0110070 A1 Jun. 10, 2004

(51) Int. Cl.⁷ .............................................. G03F 9/00
(52) U.S. Cl. ........................................................ 430/5
(58) Field of Search ............................ 430/5, 296, 322

(56) References Cited

U.S. PATENT DOCUMENTS 5,637,424 A  *  6/1997  Haruki et al. .................. 430/5

* cited by examiner

Primary Examiner—S. Rosasco
(74) Attorney, Agent, or Firm—Birch, Stewart, Kolasch & Birch, LLP

(57) ABSTRACT

A mask with extended mask window for forming patterns on a semiconductor substrate. The mask includes a main chip array having four sides for forming patterns of a main chip in a semiconductor substrate and a plurality of extended mask windows arranged around the main chip array. A method of dummy exposure using the mask includes providing a semiconductor substrate comprising a nitride layer with a plurality of main chip areas therein, and a plurality of unpatterned areas therein, forming a resist layer on the semiconductor substrate, providing an exposure mask comprising a main chip array and a plurality of extended mask windows, patterning the main chip areas of the semiconductor substrate using the main chip array of the exposure mask, patterning the unpatterned areas of the semiconductor substrate using the windows of the exposure mask, and removing the unexposed portions of the resist layer.

16 Claims, 12 Drawing Sheets

MASK WITH EXTENDED MASK CLEAR-OUT WINDOW AND METHOD OF DUMMY EXPOSURE USING THE SAME

BACKGROUND OF THE INVENTION

1. Field of the Invention

The present invention relates to a mask and a method of fabricating semiconductor device using the same, and more specifically to a mask with extended mask clear-out window and a method of dummy exposure using the same.

2. Description of the Prior Art

In shallow trench isolation (STI) process, insulating layers such as oxide or nitride layers are normally used as mask layer or etching-stop layer, which is usually etched away or entirely removed in subsequent process.

Because of the loading effect, oxide layer sometimes cannot be thoroughly removed, and residuals mostly stay in areas like the wide areas near alignment mark or areas near the wafer edge. The residuals will behave as undesired mask in following etching or photolithographic steps to cause defects.

Over-polishing is often performed to reduce residuals, but it creates other problems for the semiconductor device, such as dishing. It is necessary to add steps to protect the surface of a semiconductor device from the foregoing problems.

SUMMARY OF THE INVENTION

Therefore, the main object of the present invention is to provide a mask with an extended mask clear-out window that allows exposure of the unpatterned areas of a semiconductor wafer to reduce residual nitride in unpatterned areas of a semiconductor substrate.

In order to achieve the above object, the present invention provides a mask with extended mask clear-out window for forming patterns on a semiconductor substrate, comprising a main chip array having four sides for forming patterns of a main chip in a semiconductor substrate and a plurality of extended mask clear-out windows arranged around the main chip array.

Further, another object of the present invention is to provide a method of dummy exposure using the same that reduces residual nitride in the unpatterned area such as the area near the alignment mark, near the wafer edge, and/or other areas.

In order to achieve the above objects, the present invention provides a method of dummy exposure. First, a semiconductor substrate comprising a nitride layer, a plurality of main chip areas, and a plurality of unpatterned areas is provided. Then, a resist layer is formed on the semiconductor substrate. Next, an exposure mask comprising a main chip array and a plurality of extended mask clear-out windows is provided. Next, the main chip areas of the semiconductor substrate are patterned using the main chip array of the exposure mask. Further, the unpatterned areas of the semiconductor substrate are patterned using the mask clear-out windows of the exposure mask. Finally, the unexposed portions of the resist layer are removed.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1:
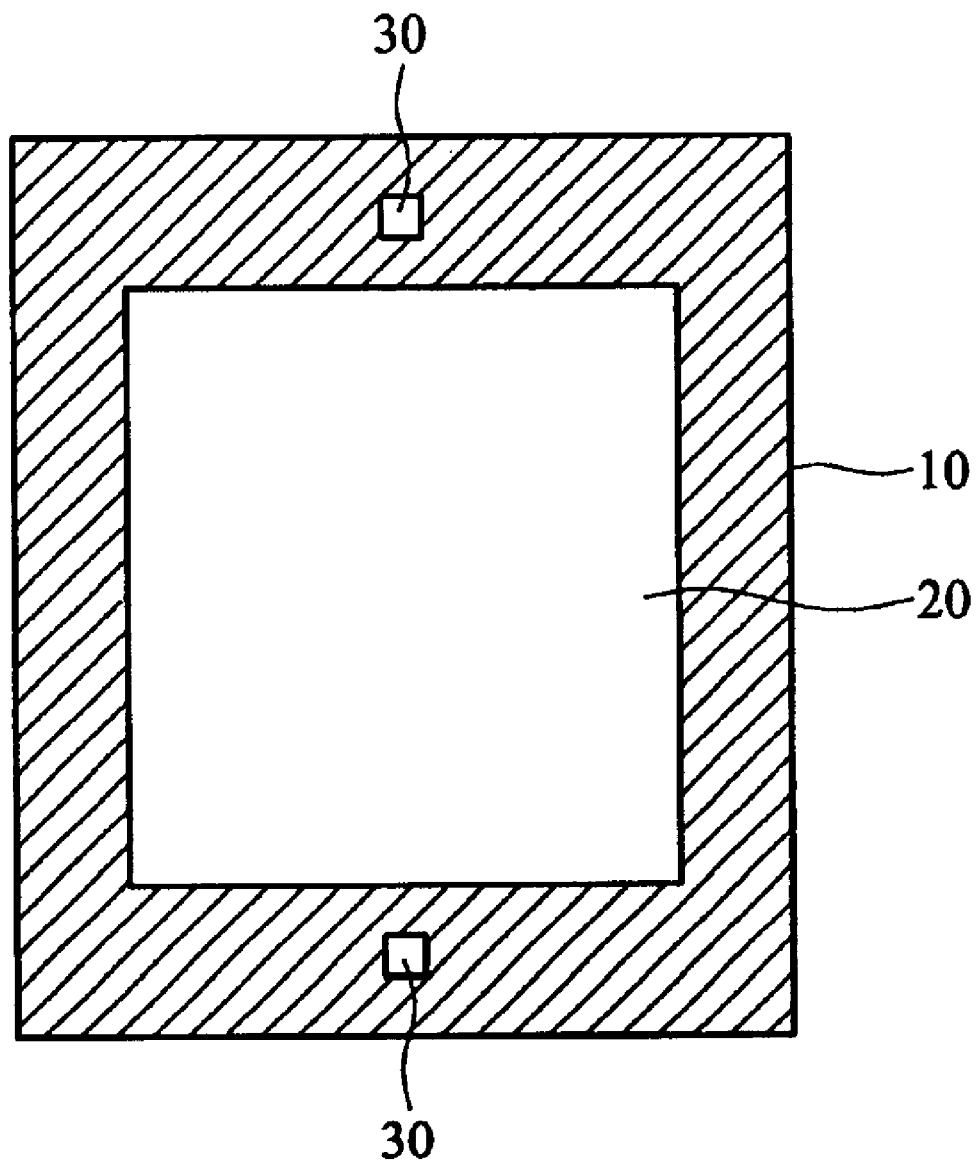
FIG. 1 shows a mask serving as a photo mask in the process of fabricating a semiconductor device.

A STI process will be explained with reference to the attached drawings. FIG. 1 shows a mask 10 serving as a photo mask for fabricating a semiconductor device and FIGS. 2A-2G illustrate manufacturing steps of a STI process of fabricating a semiconductor device using the mask 10 in FIG. 1 as a photo mask.

In FIG. 1, a mask 10 is shown, in which the main array 20 transforms its pattern to a semiconductor substrate and a mask window 30 exposes the alignment mark previously formed in the semiconductor substrate in a process such as STI.

Figure 2A:
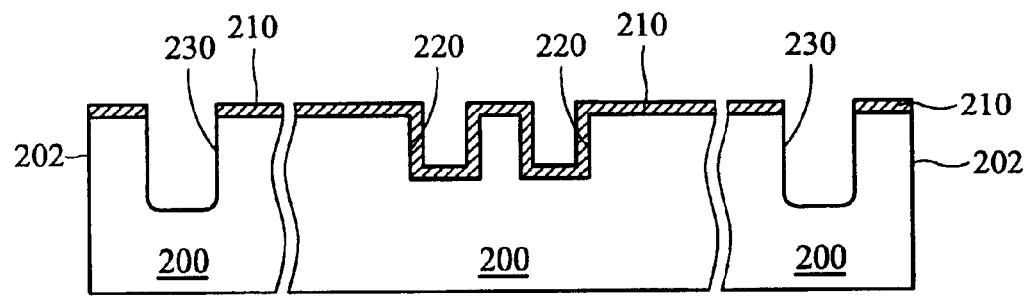
FIG. 2A through FIG. 2G are cross-sections illustrating manufacturing steps in accordance with a STI process of fabricating a semiconductor device using the mask 10 in FIG. 1 as a photo mask.
Figure 2B:
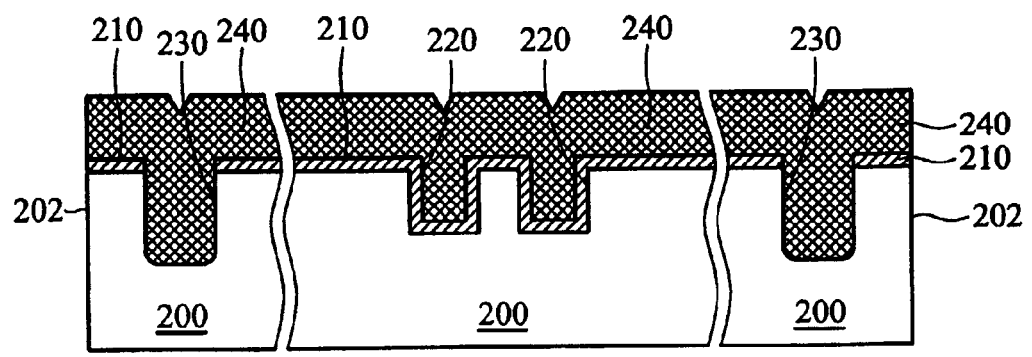
Figure 2C:
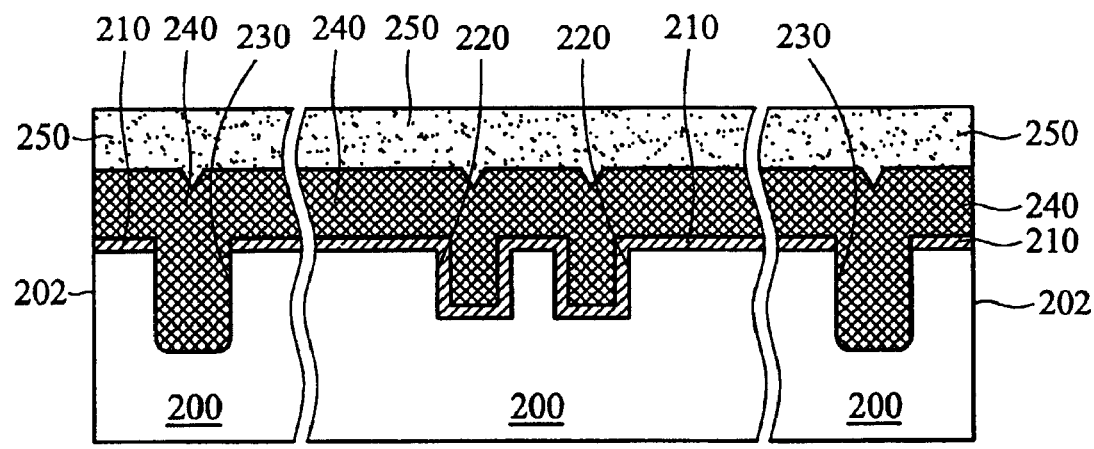
Figure 2D:
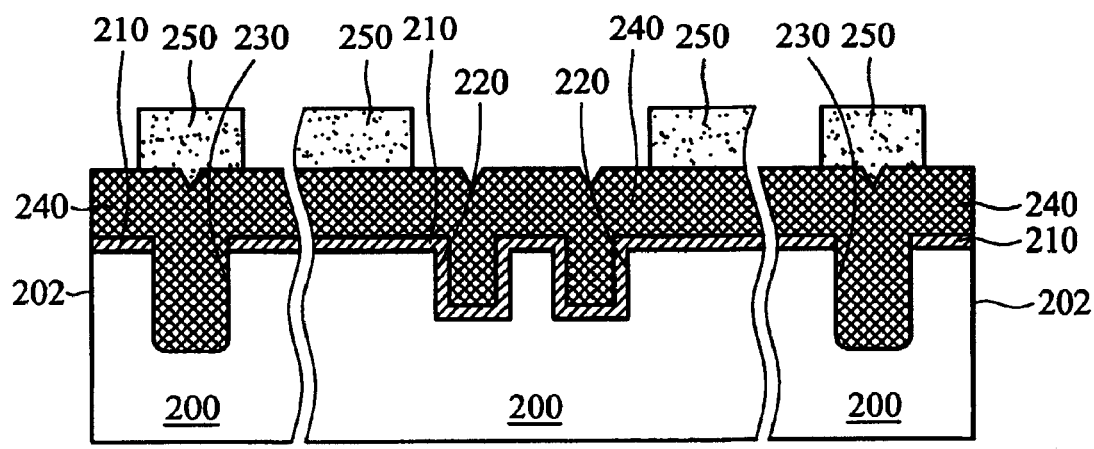
Figure 2E:
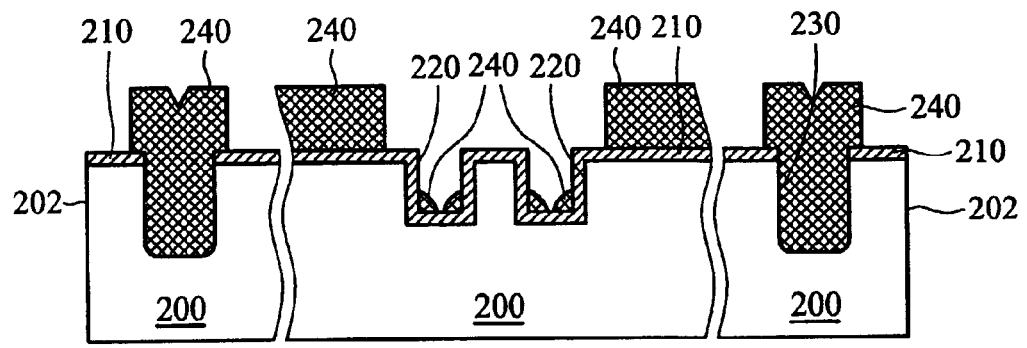
Figure 2F:
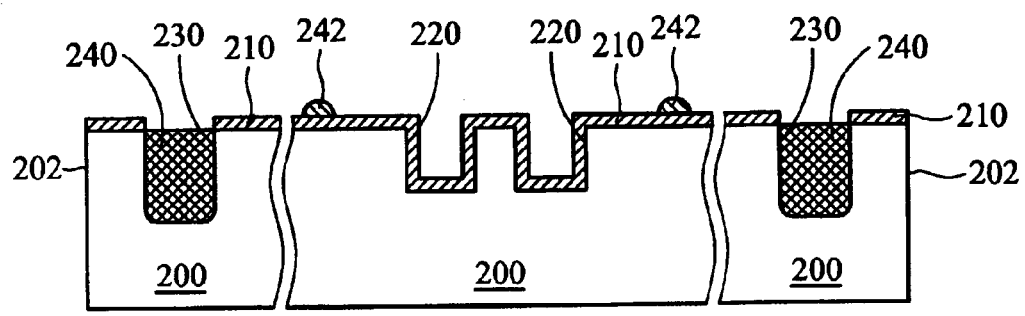
Figure 2G:
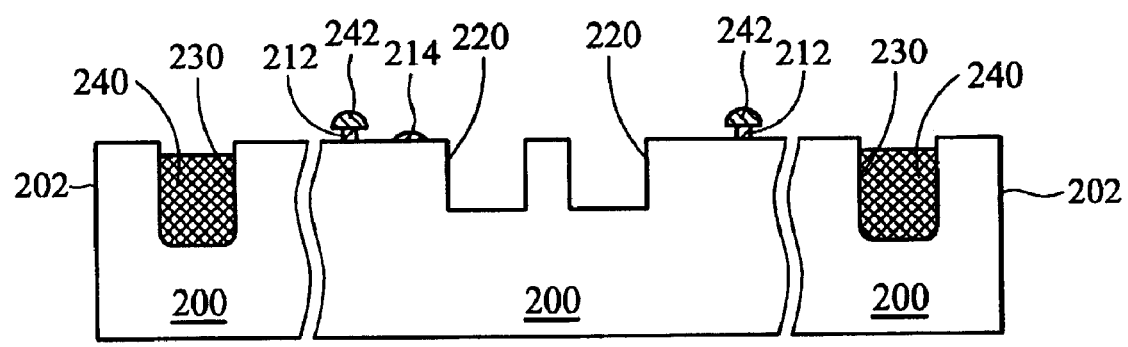

In FIG. 2A, substrate 200, which may further comprise a pad oxide layer (not shown), nitride layer 210, alignment mark 220, and shallow trench 230 formed on main chip 202, is provided. As shown in FIG. 2B, oxide layer 240 is formed by a method such as high density plasma chemical vapor deposition (HDPCVD) on substrate 200 to fill trench 230 as an isolation layer. As shown in FIG. 2C, resist layer 250 is formed as a photo resist by a method such as spin coating on oxide layer 240. As shown in FIG. 2D, resist layer 250 is patterned by mask 10 (including patterning the areas of main chip 202 by main array 20 and exposing the areas of alignment mark 220 by mask window 30) and the exposed portions of resist layer 250 are removed. As shown in FIG. 2E, the exposed portions of oxide layer 240 are etched using resist layer 250 as a mask and then resist layer 250 is removed. As shown in FIG. 2F, the other extra portions of oxide layer 240 are removed by chemical mechanical polishing (CMP). This process constitutes planarization. As shown in FIG. 2G, the nitride layer 210 is removed by a method such as etching by hot phosphoric acid solution. At the same time, residual oxide 242, serving as a hard mask rendering some portions of nitride layer 210 under residual oxide 242 irremovable, leaves residual nitride 212 on the surface of substrate 200, together with the aforementioned nitride 214 on the surface of substrate 200.

FIG. 3A through FIG. 3D show masks serving as photo masks respectively in accordance with the first embodiment of the present invention.

Figure 3A:
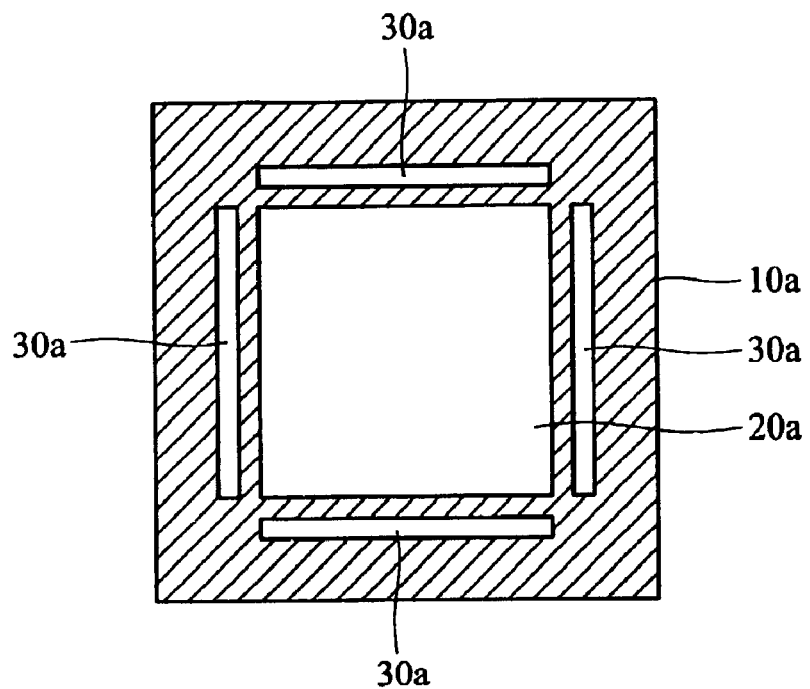
FIG. 3A through FIG. 3D show masks serving as a photo mask respectively in accordance with the first embodiment of the present invention.

In FIG. 3A, a mask 10a with a main array 20a and four extended mask clear-out windows 30a is shown. The four extended mask clear-out windows are respectively arranged around the four sides of main array 20a, wherein the longitude of each clear-out windows is substantially equal to the corresponding lateral dimension of main array.

Figure 3B:
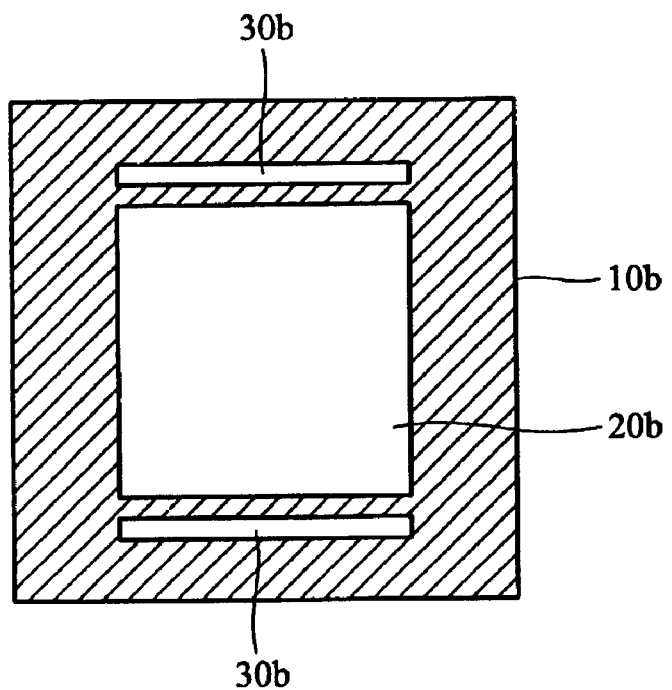
Figure 3C:
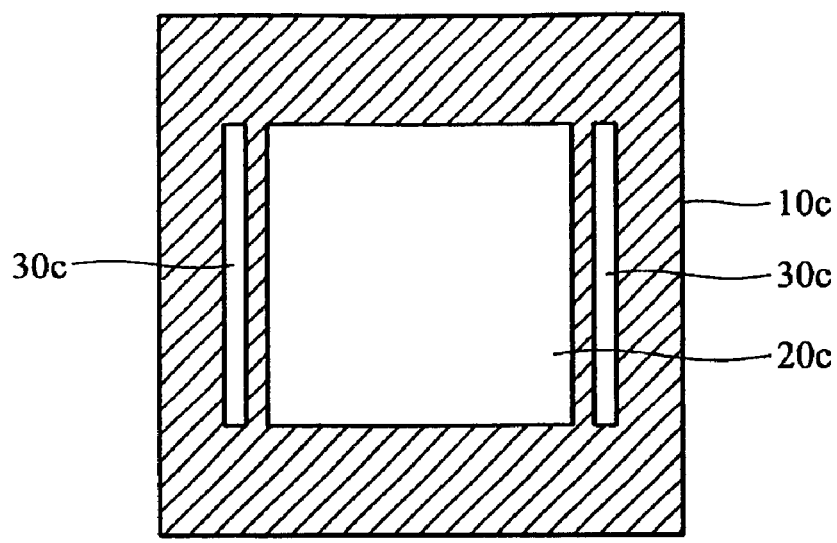

Those skilled in the art can perform modifications for mask 10a according to the necessities or limits of the process in FIG. 3B or FIG. 3C in which there are only two extended mask clear-out windows 30b arranged around the upper and lower sides of main array 20b or only two mask clear-out windows 30c arranged on the left and right sides of main array 20c.

Figure 3D:
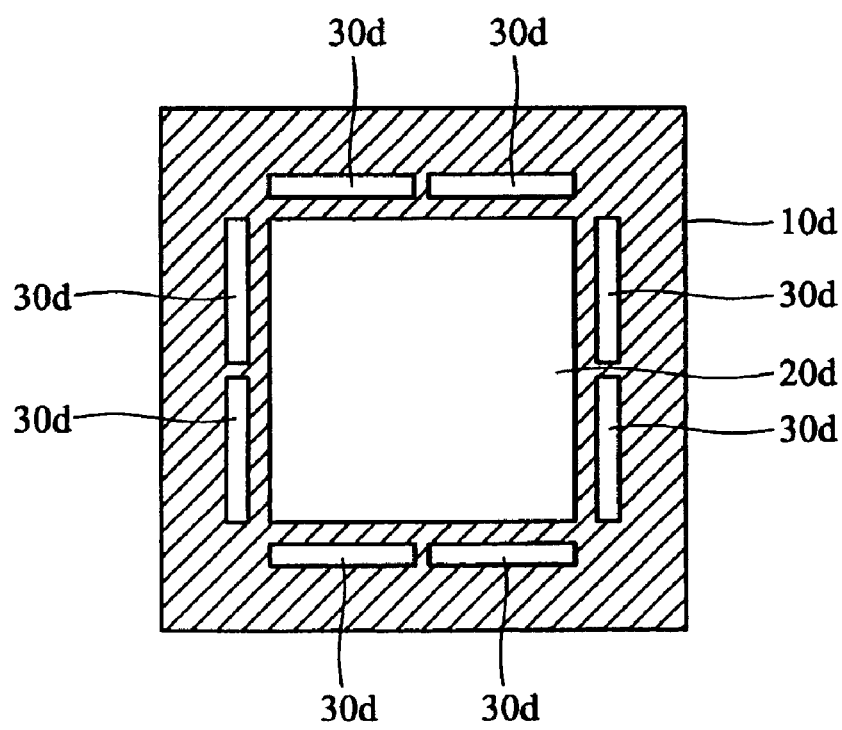

In FIG. 3D, extended mask clear-out windows 30a, as in FIG. 3A, can be divided into two portions respectively, to act as extended mask windows 30d as in FIG. 3D, according to the necessities or limits of the process. Combinations of any of the foregoing clear-out windows can also be selected.

As mentioned above, extended mask clear-out windows 30a, as in FIG. 3A, extended mask clear-out windows 30b as in FIG. 3B, or extended mask clear-out windows 30c as in FIG. 3C, can be divided into two or more portions respectively according to the necessities or limits of the process.

Note that even though there is no pattern designed in the extended mask clear-out windows 30a, 30b, 30c, 30d, and others, in accordance with the present embodiment, those skilled in the art can make modifications to design patterns into the mask clear-out windows 30a, 30b, 30c, 30d, and others, as required by the process.

FIG. 4A through FIG. 4I are cross-sections illustrating manufacturing steps of STI of fabricating a semiconductor device using mask 10a according to FIG. 3A as a photo mask in accordance with the second embodiment of the present invention.

Figure 4A:
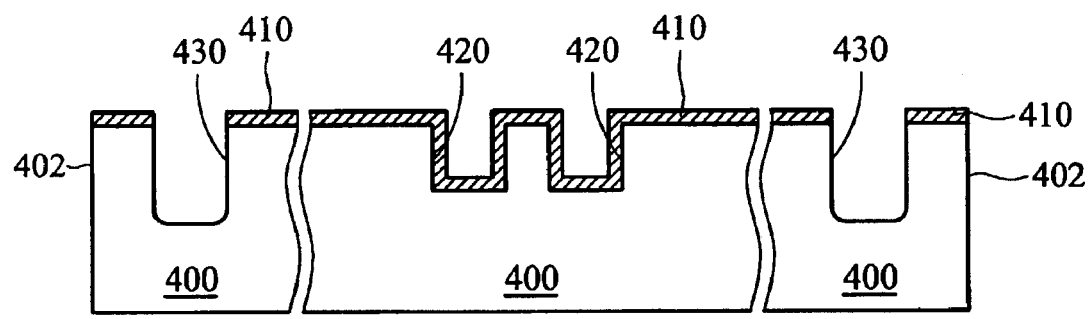
FIG. 4A through FIG. 4I are cross-sections illustrating manufacturing steps of STI of fabricating a semiconductor device using mask 10a according to FIG. 3A as a photo mask in accordance with the second embodiment of the present invention.

First, in FIG. 4A, substrate 400 such as a silicon substrate, which may further comprise a pad oxide layer (not shown), with nitride layer 410, alignment mark 420, and shallow trench 430 formed on main chip 402, is provided. Nitride layer 410 is usually about 500 Å to 2000 Å thick while shallow trench 430 is usually about 3000 Å to 2000 Å deep.

Figure 4B:
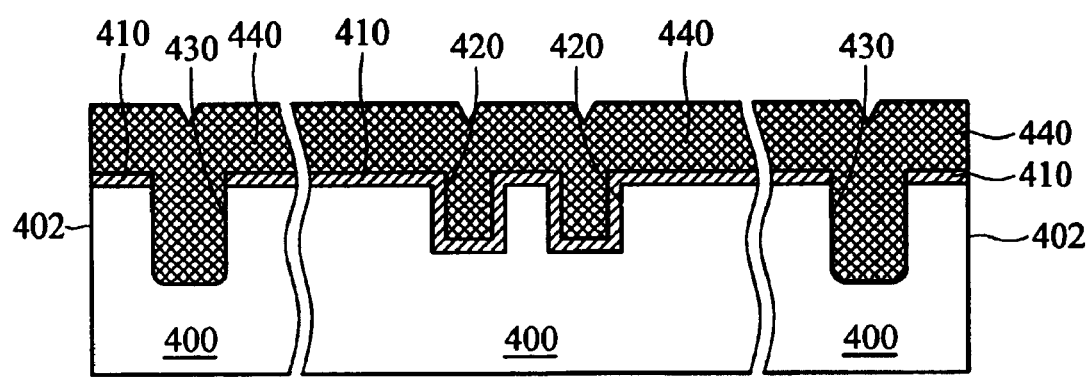

Next, in FIG. 4B, oxide layer 440 is deposited on substrate 400 to fill trench 430 as an isolation layer. Oxide layer 440 is deposited by a method such as HDPCVD, for example, using oxygen-containing gas, silicon-containing gas, and inert gas as the precursor, and a low frequency RF power source then drives the silicon (from the silicon-containing gas) and oxygen (from the oxygen-containing gas) ions towards the surface of substrate 400 to form oxide layer 440 and a high frequency bias power drives inert gas ions (typically argon) towards the surface of the substrate 400 to control and rearrange the deposition of oxide layer 440 by sputtering and dislodging oxide layer 440. The topography of oxide layer 440 is controlled by the width, depth, and arrangement of shallow trench 430 or alignment mark 420.

Figure 4C:
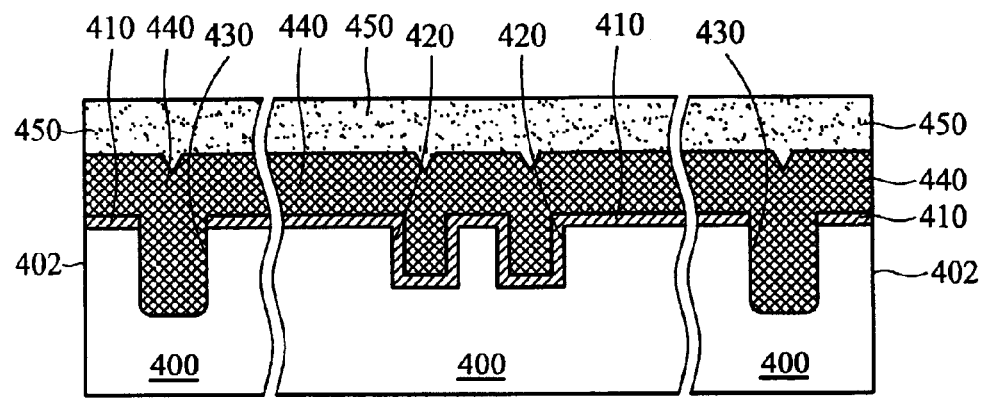

Next, in FIG. 4C, resist layer 450 is formed as a photo mask by a method such as spin coating on oxide layer 440. After patterning, the resist layer serves as a mask at etching back of oxide layer 440.

Figure 4D:
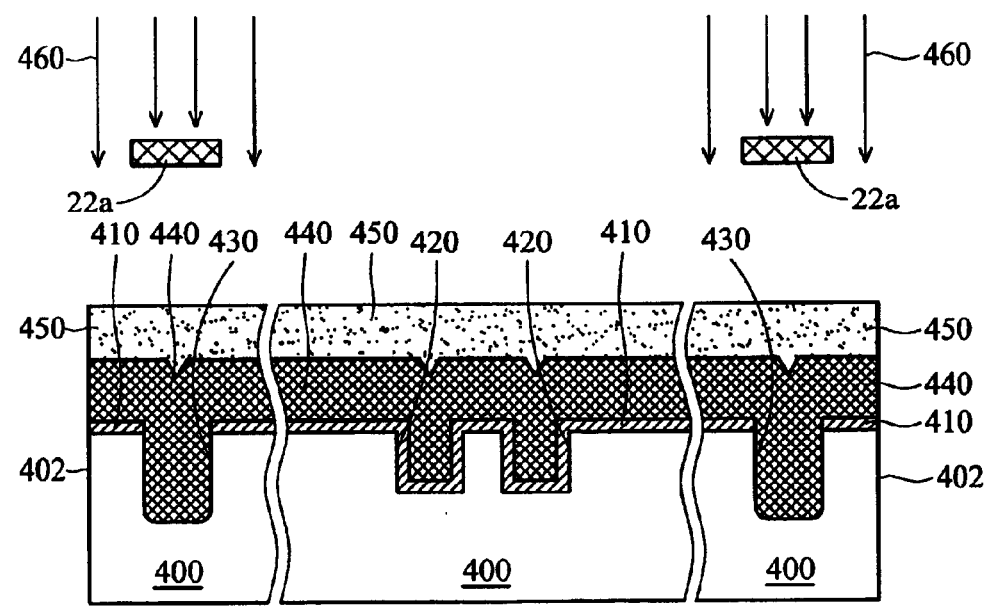

Next, in FIG. 4D, main chip 402 of substrate 400 is patterned using main array 20a of mask 10a in FIG. 3A. Pattern 22a in main array 20a serves as a shelter to protect the portions of resist layer 450 directly above the positions of shallow trench 430 of main chip 402 from exposure. Thus the portions of resist layer 450 directly above the positions of shallow trench 430 of main chip 402 can remain after development (not shown) to serve as a mask at the etching back of oxide layer 440.

Figure 4E:
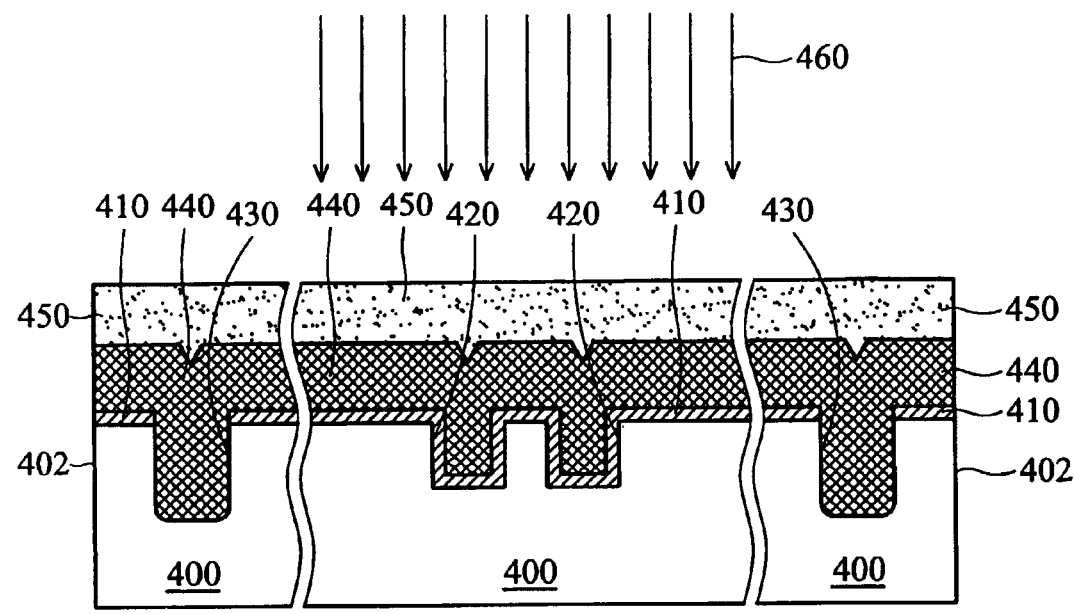

Next, the unpatterned areas such as the wide areas near alignment mark 420 and/or the wide areas near the wafer edge (not shown) are exposed using the mask windows 30a of mask 10a in FIG. 3A. Extended mask clear-out windows 30a are unpatterned. Light 460 goes through mask clear-out windows 30a and directly hits resist layer 440 above the unpatterned areas to render it removable during development (not shown). The exposed resist layer 450 is shown in FIG. 4E.

Figure 4F:
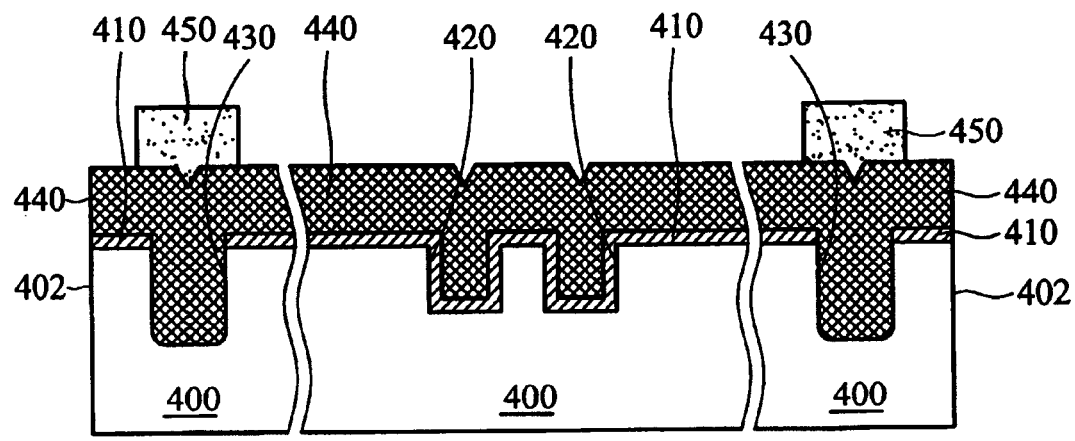

Next, in FIG. 4F, the exposed portions of resist layer 450 are removed. Note that the portions of oxide layer 440 above the unpatterned areas are exposed.

Figure 4G:
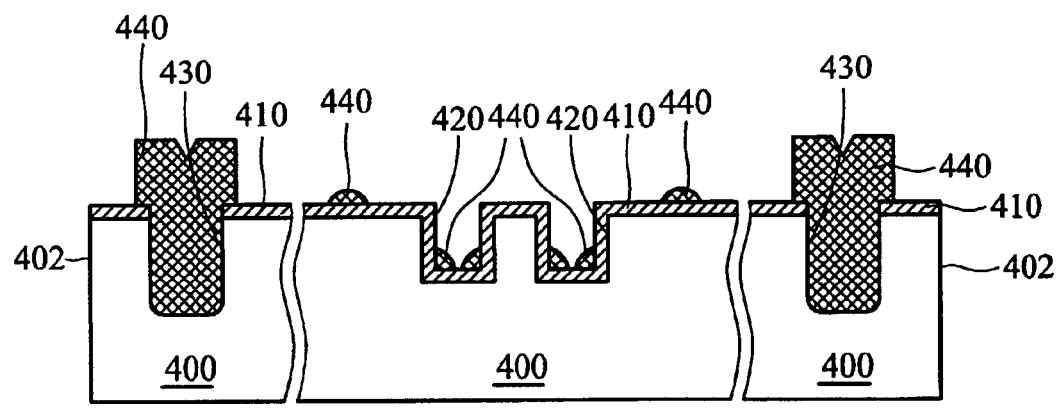

Next, in FIG. 4G, the exposed portions of oxide layer 240 are etched using resist layer 250 as a mask and resist layer 250 is removed. Although oxide layer 440 cannot be thoroughly removed in the wide area near alignment mark 420 because of the loading effect, it can be easily and thoroughly removed in the step thereafter.

Figure 4H:
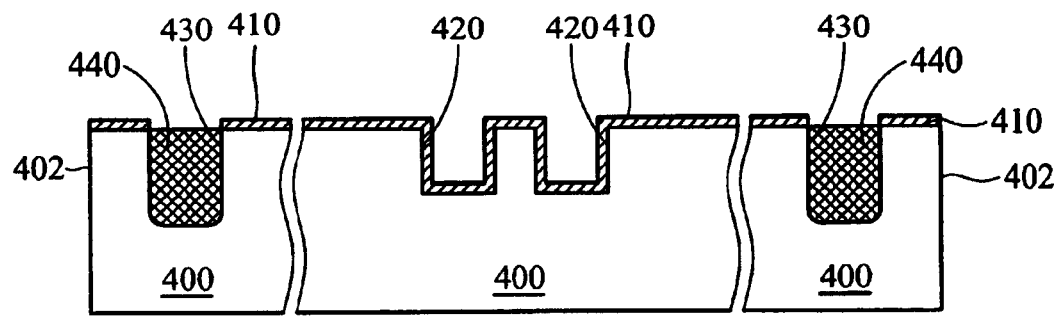

Next, in FIG. 4H, other extra portions of oxide layer 440 are removed by CMP, in planarization. Note that all of the remained oxide layer 440 in the wide area near alignment mark 420 in FIG. 4G is thoroughly removed. At the same time, nitride layer 410 specifically, in the wide area near alignment mark 420, is exposed during this planarization so as to be partially removed, helping to offset the loading effect in the process to remove nitride layer 410.

Figure 4I:
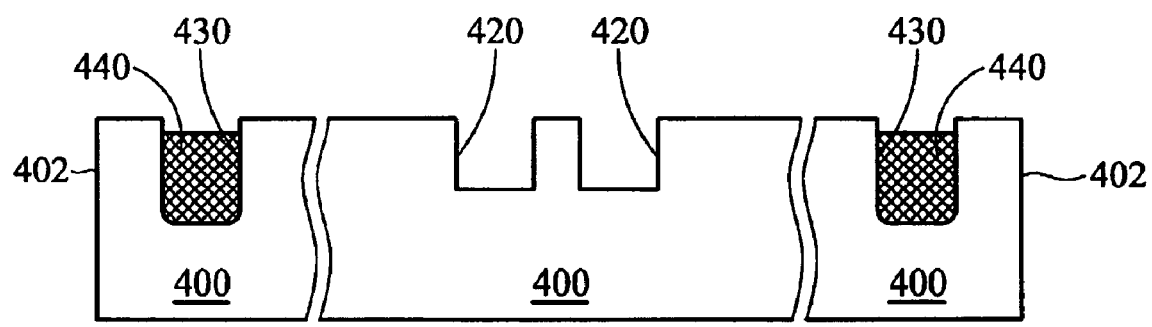

Finally, in FIG. 4I, nitride layer 410 is removed by a method such as etching by hot phosphoric acid solution. Note that nitride layer 410, specifically in the wide area near alignment mark 420, is partially removed by planarization and no oxide remains to serve as a hard mask, and thus, specifically in the wide area near alignment mark 420, can be thoroughly removed.

As compared with the prior art, one of the advantages provided by the present invention is reduction of the residual nitride in the wide, unpatterned areas mentioned previously. Residual nitride remaining in the wide, unpatterned areas lowering the reaction rate in etching, CMP, or the like compared to other narrower regions, will scratch the surface of semiconductor device if it peels in subsequent process such as CMP. The present invention solves problems of residual nitride without increasing steps in the fabricating process. Another advantage provided is to eliminate problems with residual nitride mentioned above without any risk of dishing from over-polishing or damage to the alignment mark from over-etching.

Although the present invention has been particularly shown and described above with reference to two specific embodiments, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A mask for forming patterns on a semiconductor substrate, comprising:
    a main pattern for forming a main chip in the semiconductor substrate;
    a device-free area located near a lateral side of the main pattern; and
    an extended mask clear-out pattern located within the device-free area, wherein the clear-out pattern is running in a direction substantially parallel to the lateral side of the main pattern.

2. The exposure mask as claimed in claim 1, wherein the clear-out pattern is clear tone.

3. The exposure mask as claimed in claim 1, wherein the clear-out pattern contains at least one of the L/S pattern, hole pattern and large area clear tone pattern.

4. The exposure mask as claimed in claim 1 further comprises at least one first additional clear-out pattern arranged opposite to the clear-out pattern across the main pattern.

5. The exposure mask as claimed in claim 4 further comprises a pair of second additional clear-out patterns are arranged respectively around the rest two of the four sides of the main pattern.

6. A method of dummy die exposure, comprising:
   providing a semiconductor substrate, having a main chip area, comprising a resist layer on the semiconductor substrate;
   providing an exposure mask comprising a main chip array and a plurality of extended patterns;
   patterning the main chip area of the semiconductor substrate using the main chip array of the exposure mask;
   patterning unpatterned areas beyond the main chip area of the semiconductor substrate using the mask extended patterns of the exposure mask; and
   removing the unexposed portions of the resist layer.

7. The method as claimed in claim 6, further comprising patterning dummy pattern areas of the semiconductor substrate using the main chip array of the exposure mask.

8. The method as claimed in claim 6, wherein the unpatterned areas comprise areas of the alignment marks, areas near the alignment marks, and areas near the edge of the semiconductor wafer.

9. The method as claimed in claim 6, wherein the extended mask patterns are arranged respectively around the four sides of the main chip array.

10. The method as claimed in claim 6, wherein the extended mask patterns are arranged respectively around three of the four sides of the main chip array.

11. The method as claimed in claim 6, wherein the extended mask patterns are arranged respectively around two of the four sides of the main chip array.

12. The method as claimed in claim 11, wherein the extended mask patterns are arranged respectively around opposite sides of the main chip array.

13. The method as claimed in claim 6, wherein the length of each of the extended mask clear-out windows is respectively equal to the length of the adjacent side of the main chip array.

14. The method as claimed in claim 6, wherein the length of each of the extended mask patterns is respectively equal to the length of the adjacent side of the main chip array.

15. The exposure mask as claimed in claim 6, wherein the extended patterns are clear tone.

16. The exposure mask as claimed in claim 6, wherein the extended patterns contain at least one of the L/S pattern, hole pattern and large area clear tone pattern.

* * * * *